METHOD OF MAKING THERMOELECTRIC DEVICES

Filed Aug. 24, 1967

INVENTOR
LEOPOLD SAMUEL PHILLIPS
BY Young & Thompson
ATTYS.

United States Patent Office
3,509,620
Patented May 5, 1970

3,509,620
METHOD OF MAKING THERMOELECTRIC DEVICES

Leopold Samuel Phillips, Edgware, England, assignor to United Kingdom Atomic Energy Authority, London, England Filed Aug. 24, 1967, Ser. No. 662,943
Claims priority, application Great Britain, Aug. 31, 1966, 38,946/66
Int. Cl. H01l 7/02
U.S. Cl. 29—573 17 Claims

ABSTRACT OF THE DISCLOSURE

Method of providing contact straps between the ends of adjacent pairs of thermoelectric members of an encapsulated thermoelectric power generator or refrigerator module in which the end face level of the encapsulant material surrounding the thermoelectric members is made higher than the related end faces of the thermoelectric members to define cavities corresponding to the required contact straps, which cavities are then filled with electrically conductive metal.

This invention relates to thermoelectric devices and is more particularly concerned with an improved method for providing the necessary electrical connections or so-called contact straps between the ends of adjacent pairs of thermoelectric members of an encapsulated thermoelectric power generator or refrigerator module and with modules constructed by such method.

For maximum efficiency in such devices the electrical contact resistance between the end faces of each thermoelectric member and the contact straps which interconnect such member with the adjacent thermoelectric member should be low as possible. It is desirable that the total contact resistance of the plurality of interconnections throughout the module array should be less than 1% of the total module resistance. In order to obtain the lowest contact resistance the contact straps should cover and be in electrical connection with the maximum available surface area of the end faces of each thermoelectric member.

At the present time, such contact strap interconnections are usually provided either by brazing or soldering preformed metal contact straps to the ends of pairs of thermoelectric members using a positioning jig to locate such straps during the joining operation, or by brazing or soldering all of the end faces of the thermoelectric members at each end of the module to a metal plate which is then milled or etched to define the separate straps. A further known method is to electroplate the contact straps through a suitable mask which has been previously deposited, e.g. by a photoresist or silk screen printing method.

All of such methods have the disadvantage that, in order to allow for the inaccuracies which are liable to occur in the registration of the rows of thermoelectric members in the array or in the jigging, masking, etching or milling processes, the dimensions of the contact straps must be made rather smaller than the maximum which is theoretically possible, that is, as determined solely by the dimensions of the end faces. This reduction of dimensions is inevitably accompanied by an increase of the contact resistance.

By means of the present invention the contact strap areas are defined by the encapsulant material which exists between the various thermoelectric members of the array or module. This permits substantially 100% coverage of each end face of each member with consequent minimum value contact resistance.

A further advantage is that the accompanying support of each contact strap along each of its edges by the encapsulant material reduces the risk by mechanical failure at the member-to-strap interface under conditions of thermal shock brought about by rapid changes of temperature.

Yet another advantage is that the complete coverage of the end faces of each member by the contact straps provides an effective barrier against oxidation or other chemical attack of and/or less of volatile material, e.g. tellurium, from the otherwise exposed thermoelectric material at the end faces of the members at elevated working temperature.

The method of effecting electrical interconnection between the ends of at least one adjacent pair of thermoelectric members of an encapsulated thermoelectric module comprises the steps of making the end face level of the encapsulant material surrounding and separating the thermoelectric members higher than the related end faces of said thermoelectric members so as to define a cavity extending across the end faces of the pair of thermoelectric members which are to be interconnected and then filling said cavity with electrically conductive metal to form a contact strap electrically interconnecting said thermoelectric members.

When, in the usual manner of constructing such thermoelectric modules, the ends of the thermoelectric members are substantially coincident with the end face of the surrounding encapsulant material, the end face levels of the thermoelectric members are lowered relative to the encapsulant material by removal of an end portion of each thermoelectric member together with the intervening portion of the encapsulant material lying between such pair of members.

Alternatively, however, the cavity between the pairs of thermoelectric members may be formed during the encapsulation operation by temporarily positioning a false contact strap across the ends of each of the pairs of thermoelectric members which are to be connected and then removing such false connection straps after encapsulation.

In an encapsulated thermoelectric module in accordance with this invention the encapsulant material between and around each of the thermoelectric members extends beyond such members at each end and surrounds and fills the spaces between the contact straps which interconnect the ends of adjacent pairs of said thermoelectric members.

The nature of this invention will be more readily understood from the following description of a number of embodiments thereof given by way of example with reference to the accompanying drawing in which.

Figures 1, 2, 3, 4:
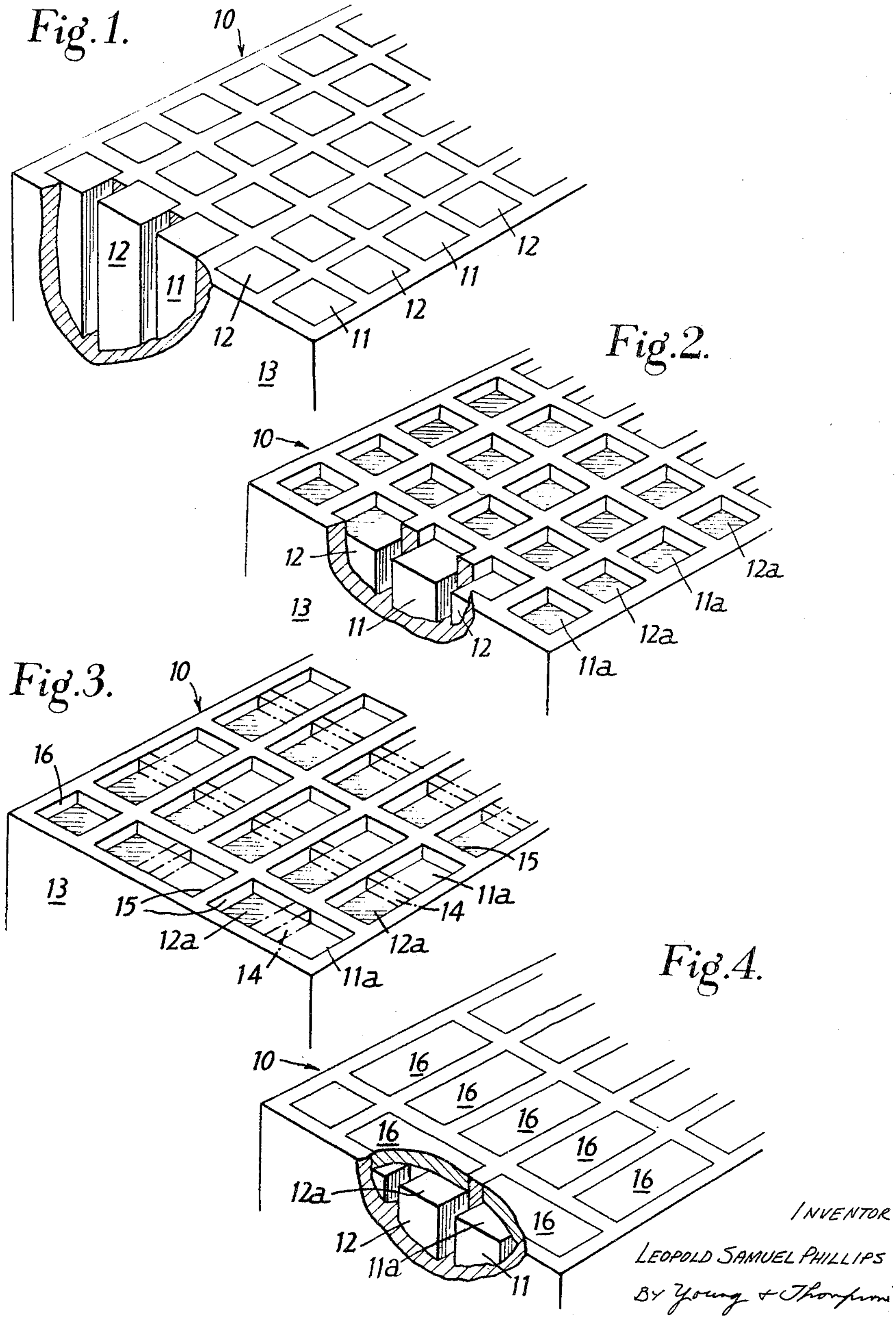
FIGURE 1 is a fragmentary perspective view, with part broken away, showing the form of a known type of thermoelectric power generator or refrigerator module.
FIGURE 2 is a fragmentary perspective view, similar to FIGURE 1, showing a first step in carrying out the method constituting one embodiment of the invention.
FIGURE 3 is a fragmentary perspective view, also similar to FIGURES 1 and 2, showing a second step in carrying out the same method embodiment of the invention.
FIGURE 4 is a further fragmentary perspective view, similar to FIGURES 1, 2 and 3, illustrating the final form of the device after completion of the construction process.

Referring to the drawing and initially to FIGURE 1 the thermoelectric module 10 has the known form of a plurality of parallel and spaced apart thermoelectric members 11, 12 formed respectively of suitably different thermoelectric materials such as p-type and n-type semiconductor materials. These thermoelectric members are embedded within an encapsulating body 13 of suitable electrical insulating material which fills all of the spaces between the thermoelectric members and preferably also provides an outer sheath or wall around all four sides of the resultant block. In such form of construction the end faces of the thermoelectric members 11, 12 at each end of the block lie flush with the end surface regions of the encapsulating material 13.

Referring now to FIGURE 2, the first step comprises the lowering of the end faces 11*a*, 12*a* of the thermoelectric members 11, 12 by a distance at least equal to the required thickness of the contact straps. Then, as shown in FIGURE 3, the intervening portions of the encapsulating material 13 lying between each of the pairs of members 11, 12 which are to be interconnected, as indicated in chain-dotted lines at 14, are then removed to form a series of cavities 15 each extending over the entire surface area of the two members to be interconnected. Smaller cavities 16 covering only the area of a single member 11 or 12 form end terminal connections to the module. Such cavities, defined around their entire perimeter by the encapsulating material 13, are then filled with conductive metal as shown at 16 in FIGURE 4.

The required lowering of the end faces of the thermoelectric members 11, 12 as shown in FIGURE 2 may be effected in a variety of ways. One method is by shot blasting the end surfaces of the encapsulated module. The brittle thermoelectric material of the members 11, 12, for instance, bismuth telluside, is eroded far more rapidly than the encapsulant material 13, such as epoxy resin. Another method is by chemical etching while a further method employs electrolytic etching.

The removal of the intervening portions 14 of the encapsulant material 13 between the two members 11 and 12 which are to be joined, as shown in FIGURE 3, may be effected by a machining operation, e.g. with a high speed burr, an end mill or other form of grinding wheel. Alternatively the removal of such intervening portions may be effected by spark or ultrasonic machining.

In another embodiment method of the invention the above mentioned methods of removing the intervening portions 14 of encapsulating material may be used to lower the level of the end faces of the thermoelectric members 11, 12 at the same time. In such case the operation may be performed by an automatic, programmed controlled machine and, in the case of ultrasonic machining, with a multiple drill head provided the register of the various thermoelectric members 11, 12 within the encapsulated module is sufficient accurate.

In yet a further alternative method embodiment of this invention, false connector straps are temporarily positioned across the ends of the assembled array of thermoelectric members 11, 12 prior to their encapsulation which is then carried out to the level of the top surfaces of such straps. The latter are then removed to leave the encapsulant material, exactly as shown in FIGURE 3 of the drawing, standing proud around the cavities 15 for receiving the conductive metal. In this method also accurate register of the thermoelectric members 11, 12 is necessary to achieve useful improvement over conventional methods.

The filling of the cavities 15 (FIGURE 3) to form the conductive straps 16 (FIGURE 4) may be effected by deposition of a suitable metal, e.g. gold, copper, nickel, by electroplating or by flame or plasma spraying or by other suitable known methods.

After the application of the strap material the opposite end faces of the module are subjected to a lapping operation to remove any excess strap material and to provide the module with end faces which are truly flat and in which the exposed surfaces of the straps 16 are flush with the top surface regions of the surrounding encapsulant material 13.

I claim:

1. The method of constructing a thermoelectric device comprising at least one pair of thermoelectric members disposed adjacent one another and having an electrical connection therebetween at one end, which comprises the steps of embedding said thermoelectric members in a body of electrical insulating material by an encapsulating process in which said insulating material fills all of the spaces between said thermoelectric members, making the end face level of such encapsulating material surrounding the pair of thermoelectric members which are to be interconnected to have a level higher than the related end faces of said thermoelectric members and the encapsulating material lying therebetween so as to define a single cavity extending across the end faces of said pair of thermoelectric members and then filling said cavity with electrically conductive metal to form a contact strap electrically interconnecting the adjacent ends of said thermoelectric members.

2. The method of constructing a thermoelectric module comprising at least one pair of thermoelectric members which are disposed adjacent one another and electrically interconnected at one end, which method comprises the steps of embedding said thermoelectric members in a body of electrical insulating material by an encapsulating process by which said insulating material fills all of the spaces between said thermoelectric members and by which the ends of said thermoelectric members to be interconnected are substantially coincident with the end face of the surrounding body of encapsulant material, lowering the end face levels of said thermoelectric members relative to the encapsulant material by removal of an end portion of each thermoelectric member, removing the intervening portion of the encapsulant material lying between said pair of members and then filling the single cavity so formed with electrically conductive metal to form a contact strap electrically interconnecting the ends of said pair of thermoelectric members.

3. The method according to claim 2 in which the thermoelectric material is removed by shot blasting applied to the end face of the module.

4. The method according to claim 2 in which the end portions of the thermoelectric members are removed by chemical etching.

5. The method according to claim 2 in which the end portions of the thermoelectric members are removed by electrolytic etching.

6. The method according to claim 2 in which the intervening portion of the encapsulant material is removed by a machining operation.

7. The method according to claim 2 in which the intervening portion of the encapsulant material is removed by grinding.

8. The method according to claim 2 in which the removal of the end portions of each thermoelectric member and the intervening portion of encapsulant material is effected in a single machining operation.

9. The method according to claim 1 which comprises the step of forming the required cavity during said encapsulation process by the temporary positioning of a false connector strap across the ends of the pair of thermoelectric members to be connected and the removal of such false connection strap after encapsulation.

10. The method according to claim 2 which includes the step of filling the said cavity with conductive metal by electroplating such metal.

11. The method according to claim 2 which includes the step of filling the cavity with conductive metal by flame spraying such metal.

12. The method according to claim 2 which includes the step of filling the cavity with conductive metal by plasma spraying such metal.

13. The method according to claim 2 which comprises the further step of subjecting the end face of the module after filling of said cavity to a lapping operation to provide a flat end face in which the exposed surface of the contact strap is flush with the surface of the encapsulant material.

14. The method according to claim 2 of constructing an encapsulated thermoelectric module comprising a plurality of pairs of thermoelectric members in which the ends of all of the adjacent pairs of thermoelectric members which are to be interconnected at each end face of the module are interconnected by the same method.

15. The method according to claim 8 which includes the step of filling said cavity with conductive metal by an electro-deposition process.

16. The method according to claim 15 which comprises the further step of subjecting the end face of the module after filling of said cavity to a lapping operation to provide a flat end face in which the exposed surface of the contact strap is flush with the surface of the encapsulant material.

17. The method according to claim 16 of constructing an encapsulated thermoelectric module comprising a plurality of pairs of thermoelectric members in which the ends of all of the adjacent pairs of thermoelectric members which are to be interconnected at each end face of the module are interconnected by the same method.

References Cited

UNITED STATES PATENTS

| | | | |
|---|---|---|---|
| 2,668,932 | 2/1954 | Kliever | 317—101 |
| 2,980,746 | 4/1961 | Claydon. | |
| 3,076,051 | 1/1963 | Haba. | |

FOREIGN PATENTS

| | | |
|---|---|---|
| 587,490 | 4/1947 | Great Britain. |
| 919,147 | 2/1963 | Great Britain. |

PAUL M. COHEN, Primary Examiner

U.S. Cl. X.R.

29—577, 626, 627; 136—211